United States Patent [19]
Toole et al.

[11] 4,268,538
[45] May 19, 1981

[54] HIGH-PRESSURE, HIGH-TEMPERATURE GASEOUS CHEMICAL METHOD FOR SILICON OXIDATION

[75] Inventors: Monte M. Toole, Mill Valley; Raphael Klein, Los Altos, both of Calif.

[73] Assignee: Atomel Corporation, Mountain View, Calif.

[21] Appl. No.: 24,989

[22] Filed: Mar. 29, 1979

Related U.S. Application Data

[62] Division of Ser. No. 775,963, Mar. 9, 1977, Pat. No. 4,167,915.

[51] Int. Cl.³ .......................................... H01L 21/316
[52] U.S. Cl. ....................................... 427/93; 427/255; 427/255.3; 427/255.4
[58] Field of Search ................. 427/93, 255, 255.3, 427/255.4; 118/724, 708, 692

[56] References Cited

U.S. PATENT DOCUMENTS

| | | | |
|---|---|---|---|
| 4,018,184 | 4/1977 | Nagasawa et al. | 118/715 |
| 4,139,658 | 2/1979 | Cohen et al. | 427/93 |
| 4,167,915 | 9/1979 | Toole et al. | 427/93 |

OTHER PUBLICATIONS

Tsubouchi et al., "High Pressure Steam Apparatus for Oxidation of Silicon", Japan J. Appl. Phys., vol. 16, No. 6, p. 1055, Jun. 1977.
Tsubouchi et al., "Oxidation of Silicon in High Pressure Steam", Japan J. Appl. Phys., vol 16, No. 5, p. 855, May, 1977.
Ligenza, "Oxidation of Silicon by High Pressure Steam", Journal of Electrochemical Soc., Feb. 1962, pp. 73–76.
Panousis et al., "High Pressure Steam Apparatus for the Accelerated Oxidation of Silicon", Abstract No. 53, Spring Meeting of Electro-Chemical Soc. Chicago, May 13–18, 1973.
Powell, "Selective Oxidation of Silicon in Low-Temperature High Pressure Steam", IEEE Transactions on Electron Devices, vol. ed-21, No. 10, Oct. 1974.

*Primary Examiner*—John D. Smith
*Attorney, Agent, or Firm*—Manfred M. Warren; Robert B. Chickering; Glen R. Grunewald

[57] ABSTRACT

Apparatus and method for growing oxide on silicon wafers or silicon-coated wafers or other semiconductors for the semiconductor industry wherein the oxide growth is produced under high pressure and high temperature conditions within a reaction chamber by oxidizing gases which are maintained in a continuous flow condition into and through the chamber.

8 Claims, 1 Drawing Figure

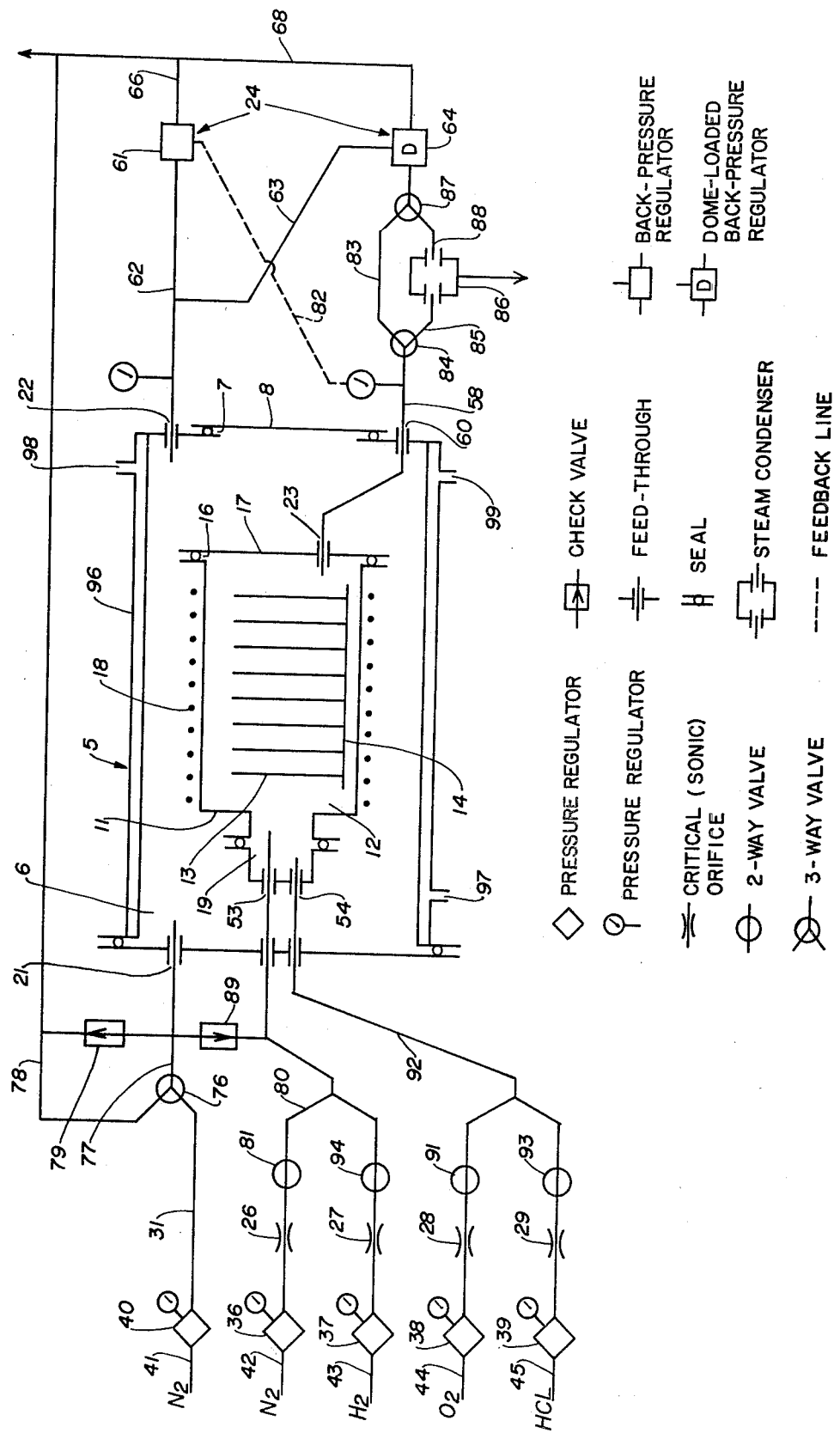

1

HIGH-PRESSURE, HIGH-TEMPERATURE GASEOUS CHEMICAL METHOD FOR SILICON OXIDATION

This is a division of application Ser. No. 775,963, filed Mar. 9, 1977, now U.S. Pat. No. 4,167,915.

BACKGROUND OF THE INVENTION

1. Field of Invention

The invention relates to apparatus and processes for growing oxides on silicon wafers, silicon-coated wafers or other semiconductors, as used in the semiconductor industry.

2. Description of Prior Art

Oxygen or steam is commonly used for growing oxide on silicon wafers. As the oxide grows thicker, it forms more slowly. In semiconductor manufacturing there has been a developing need for thicker oxide coatings, which, under available techniques having relatively low growth rates, require very long periods of processing time. In an effort to speed up the growth rate, the temperature in the reaction chamber has been increased in the range of about 1,000°–1,200° C. However, high temperature may have a disturbing effect on previously diffused work, and processors would, accordingly, like to hold the temperature down to a range of about 700°–950° C., which, in turn, prolongs the oxidation process.

Another developing need in semiconductor manufacturing is the use of larger diameter silicon wafers so as to obtain a higher yield of usable semiconductor chips, which generally increases as the square of the diameter of the wafer. The wafers are, however, very thin, typically 10–15 mils., and as the size increases, so do mechanical gradients, which are exacerbated at high temperatures. Accordingly, oxidation of the wafers at lower temperatures, say 700°–950° C., will permit the handling of larger diameter wafers, with their significantly increased chip yield.

It is known that the rate of growth of oxide on a silicon wafer in a proper environment is a function of time, temperature and pressure, see article entitled "Oxidation of Silicon by High-Pressure Steam," by Ligenza, Bell Telephone Laboratories, pages 73–76, *Journal of the Electrochemical Society*, February, 1962, and Abstract No. 53 entitled "High Pressure Steam Apparatus for the Accelerated Oxidation of Silicon," by Panousis and Schneider, Bell Telephone Laboratories, Spring Meeting of the Electrochemical Society in Chicago, May 13–18, 1973.

In the first of the noted publications, experiments were conducted in sealed bombs. The silicon sample and a measured amount of water were sealed in the bomb and the latter heated to a range of about 777°–1123° K. The measured water quantity/temperature was calculated to produce a pressurized steam atmosphere within the bomb at variously between 25–400 atms. for times ranging from ½ hour to 8 hours.

The structure described in Abstract No. 53 represented some advance in that the steam pressure within the reaction chamber was established by a pressure regulator, rather than the more imprecise water calculation. The structure included a boiler for generating steam, which was fed through a pressure regulator into a stainless steel pressure vessel containing the silicon slices to be oxidized, and a surrounding alumina sleeve having heating coils therearound for raising the temperature within the chamber into the range of 900°–1,200° C. In this structure the entire interior of the chamber was subjected to the oxidizing effect of the steam, and no attempt was made to isolate the wafers for processing in a "clean room" condition. Also, water, however prepared, filtered, distilled, etc., is still likely to have chemical particulate contaminants which cannot be tolerated in semiconductor manufacturing.

For additional prior art, see article entitled "Selective Oxidation of Silicon in Low-Temperature High-Pressure Steam," authored by Powell, Ligenza and Schneider and published in *IEEE Transactions on Electron Devices*, Vol. ED-21, No. 10, October, 1974. High-pressure systems, while demonstrated in the laboratory, have not been available in commercial structures.

SUMMARY OF INVENTION

One of the features of the present invention is the utilization of pyrosynthesis, that is, the introducing into the reaction chamber enclosing the wafer to be oxidized of hydrogen and oxygen gas, which are introduced in very pure form and in carefully controlled ratios and combined to accelerate the growth of the oxide. The present apparatus and its ability to introduce pure gases under pressure enables the production of other surface forms, for example silicon nitride. Very precise metering of the reacting gases is obtained by the use of critical sonic orifices, which have as a characteristic, unlike pressure regulators and the like, an insensitivity to variations in downstream pressures, thus permitting carefully controlled introduction of selected gases in ratios having a precision not heretofore possible.

Growing of the oxide is effected in an enclosed quartz-walled reaction chamber under elevated pressure and the quartz vessel is mounted in a surrounding high-pressure blanket of inert gas and the internal and external pressures are balanced to permit the attainment of high pressure of the active gases within the reaction chamber.

The present invention provides apparatus and method for oxidizing silicon wafers of large size in a "clean room" condition under simultaneous conditions of high pressure and high temperature to produce accelerated, controlled oxide growth of the highest quality and without disturbing previously infused work. A key feature is the isolation of the silicon wafers from the environment, thus ensuring "MOS cleanliness" by prevention of contamination by sodium, heavy metals and the like.

Another feature of the present invention is the provision of a continuous "flow through" system wherein fresh, pure, precisely metered gases are introduced into the reaction chamber, react with each other and the silicon, and are withdrawn from the reaction chamber, together with reaction products, in a continuous flow.

The invention possesses other objects and features of advantage, some of which of the foregoing will be set forth in the following description of the preferred form of the invention which is illustrated in the drawing accompanying and forming part of this specification. It is to be understood, however, that variations in the showing made by the said drawing and description may be adopted within the scope of the invention as set forth in the claims.

BRIEF DESCRIPTION OF THE DRAWING

The FIGURE shows a high-pressure, high-temperature silicon-oxidizing apparatus constructed in accordance with the present invention in longitudinal cross-section and with the gas-feeding and control portion of the apparatus in diagrammatic representation.

DETAILED DESCRIPTION OF INVENTION

The apparatus of the present invention comprises, briefly, a housing 5, providing a pressure chamber 6 and an access opening 7 therefore and a closure 8 for opening 7; a vessel 11 mounted in chamber 6 and formed with an enclosed reaction chamber 12 dimensioned for receipt of silicon wafers 13 to be oxidized, the latter being typically mounted in a boat 14, vessel 11 being formed with an access opening 16 having a closure 17 therefor; means 18 for heating the reaction chamber; vessel 11 having an inlet 19 for introducing oxygen gas and hydrogen gas, both under pressure, into the reaction chamber; and housing 5 having an inlet 21 for introducing an inert gas under pressure into chamber 6 external of vessel 11 for equalizing the pressures in chambers 6 and 12.

As another feature of the present invention, housing 5 and vessel 11 are provided with discharge passages 22 and 23, and pressure regulating means 24 is connected to discharge passages 22 and 23 to maintain a continuous flow of gases into and through reaction chamber 12 while maintaining the pressure equalization between chamber 6 and 12. This equalization of pressure enables the use of a relatively thin wall quartz tube for vessel 11 so that the wafers and the oxidizing process may take place in "clean room" conditions, totally isolated from any contaminants present in the heating and pressurizing structure external of the quartz tube. Heating may be conveniently provided by a wire-wound heating element placed in surrounding relation to tube 11, as illustrated, thus physically locating the heating element in the external pressure chamber 6.

In the apparatus and method of the present invention, very pure gas is introduced under pressure into the reaction chamber to provide oxidation of the silicon wafers, instead of the use of steam as practiced in the prior art. Gases, such as oxygen and hydrogen, are obtainable in very pure form as compared to water or steam, and where both hydrogen and oxygen are introduced into the reaction chamber under pressure and at high temperature, there is a reaction, not only between the gases and the silicon, but also between the gases themselves, to produce steam and pyrolythic oxide on the surface of the silicon wafer. Another and important feature of the present invention is the precise metering of the gases into the reaction chamber and the ability to control the ratios of hydrogen to oxygen for creating the desired character and growth rate of the oxide. This precise control of the gases is here effected by the use of a critical sonic orifice in the oxygen and hydrogen gas lines.

In the accompanying drawing, critical sonic orifices are illustrated in the several gas lines at 26, 27, 28, and 29. Critical sonic orifices have the characteristic that gas flows therethrough are insensitive to downstream back pressures so long as sonic velocity is attained through the orifice. Such orifices are more fully described in *Essentials of Fluid Dynamics, by Prandtl, Chapter IV, page* 266, Haeffner Publishing Co., 1952. Preferably, and as here shown, there is incorporated in each of the gas lines containing critical sonic orifices 26–29, and upstream of the orifices, pressure regulators 36, 37, 38, 39.

With reference to the accompanying drawing, a total of five gas input lines 41, 42, 43, 44 and 45 are here used. Lines 41 and 42 are connected to a source of nitrogen (here providing the inert gas), it being noted that line 42 is provided with a pressure regulator 40 in the same manner as lines 42–45. Lines 43, 44 and 45 are adapted for connection to sources, under pressure, of hydrogen gas, oxygen gas and hydrogen chloride gas, respectively.

The plumbing arrangement shown in the drawing enables the introduction of various gases into reaction chamber 12, as well as inert gas (nitrogen) in the external pressure chamber 6, so that simultaneous increases and reductions in pressure in the two chambers can be effected under precisely controlled conditions.

The plumbing arrangement also enables the introduction of hydrogen chloride gas into the reaction chamber, this gas functioning as a "getter" for contaminants, particularly sodium. It has been found that by purging the reaction chamber with hydrogen chloride it is possible to remove the great majority of contaminants that would otherwise be available to the silicon wafers. In the normal process, it is recommended that the reaction chamber be cleaned or purged with a mixture of hydrogen chloride gas and either oxygen or nitrogen prior to the oxidation process. Another method of "gettering" sodium is by incorporating chlorine atoms in the oxide (from the hydrogen chloride which will be present, in this case, in the reaction chamber).

The pressure-regulating means 24 for equalizing the pressure in chamber 6 and 12 here comprises a back pressure regulator 61 whose inlet line 62 is connected to outlet 22, by conduit 63 to a second back pressure regulator 64 here functioning as a dome-loaded regulator, and to vent conduit 66. Dome-loaded regulator 64 is here connected to three-way valve 87, which is connected through a parallel path to three-way valve 84. The parallel path is comprised of conduit 83, on the one hand, and of conduit 88 through condensor 86 to conduit 85 on the other hand. Back pressure regulators manufactured by Veriflo Corp. of Richmond, Calif. and identified as part numbers BPR 40 may be used for regulators 61 and 64. Regulator 61 is adjustable through a range of 0 to hundreds of psi and controlled by feedback line 82. Regulator 64 is dome-loaded by its connection to conduit 63 and is spring-biased so as to constantly regulate the flow of gases therethrough and to vent line 68 while maintaining a balance of pressure in chambers 6 and 12.

The parallel path between valves 84 and 87 is provided to prevent corrosion of regulator 64 by wetted hydrogen chloride. Path 83 is used to bypass the steam condensor 86 when the mixtures oxygen-hydrogen chloride or nitrogen-hydrogen chloride are used. Path 85-86-88 is used when the mixtures oxygen-hydrogen (with/without nitrogen) is used, thereby generating steam. The condensor 86 is used to automatically condense and drain the water generated in the reaction. Three-way valve 84 is connected to outlet 23 of reaction chamber 12 by conduit 58 passing through outlet 60 in housing 5.

With reference to the plumbing detail shown in the drawing, line 41 is connected to a pressure regulator 40 and then by conduit 31 to three-way valve 76, in turn connected by conduit 77 to inlet 21 for pressure chamber 6. Valve 76 is also connected by conduit 78 to vent; and check valve 79 is connected across conduits 77 and 78, as shown, as a safety measure, to prevent over-pressurizing of chamber 6. Line 42 is connected downstream from critical sonic orifice 26 to two-way valve 81, which is, in turn, connected by conduit 80 to inlet 19. A check valve 89 is connected, as illustrated, between conduits 77 and 82, as a safety measure, to prevent implosion of chamber 12 if the proper balance between it and chamber 6 is upset, upon an allowed predetermined limit. Line 44 is connected downstream from orifice 28 to a two-way valve 91, which is, in turn, connected by conduit 92 to inlet 54, entering into inlet passage 19 for chamber 12. Line 45 is connected downstream from orifice 29 to a two-way valve 93, which is, in turn, connected to conduit 92. Line 43 is connected downstream from orifice 27 to two-way valve 94, which is, in turn, connected to conduit 80, which extends through a second inlet passage 53 into the inlet portion 19 of chamber 12, parallel to inlet 54. The separate feeding of hydrogen and oxygen by a pair of conduits 43 and 44 through inlets 53 and 54 is necessary to ensure proper initiation of the reaction. Conduit 80 extends into the reaction chamber a sufficient distance to place the delivery end of the conduit in a temperature zone above the ignition temperature of hydrogen and oxygen.

Housing 5 is, preferably, cooled during the high temperature oxidizing process by either air or water cooling. A water jacket 96 is here shown around housing 5, having water inlet, discharge and drain openings 97, 98 and 99 respectively.

A typical operation of the apparatus and method of the present invention is set forth in the following chart, showing a suggested sequence and use of the various gases and pressures.

What is claimed is:

1. A high-pressure, high-temperature silicon oxidation process comprising:
mounting silicon wafers to be oxidized in an enclosed quartz-walled reaction chamber mounted within a pressure chamber;
heating said reaction chamber;
pressurizing said reaction chamber with oxygen and hydrogen gases; and
pressurizing said pressure chamber with a gas to equalize the pressure across the wall of said reaction chamber.

2. The process of claim 1, and
providing a continuous flow of said oxygen and hydrogen gases into and through said reaction chamber while maintaining the pressurized condition therein.

3. The process of claim 2:
initially pressurizing said reaction chamber with essentially oxygen gas;
thereafter pressurizing said reaction chamber with the combination of oxygen and hydrogen gases; and
thereafter pressurizing said reaction chamber with essentially nitrogen gas.

4. The process of claim 3, and
introducing hydrogen chloride gas into said reaction chamber during at least one of said steps.

5. The process of claim 2, and controlling said flow of oxygen and hydrogen gases into said chamber through critical sonic orifices.

6. The process of claim 5, and providing a controlled gas ratio flow through a critical sonic orifice of inert gas into said reaction chamber.

7. The process of claim 6, said inert gas being nitrogen.

8. The process of claim 7, and including the step of purging said reaction chamber with said inert gas.

TYPICAL SET-UP FOR VARIOUS PROCESSES

| No. | Operation | Duration | HIGH PRESSURE (OXIDATION) | | | | LOW PRESSURE (TUBE CLEAN) | |
|---|---|---|---|---|---|---|---|---|
| | | | to tube | | | to shell | to tube | |
| | | | $N_2$ @ 300 psi | $O_2$ @ 300 psi | $H_2$ @ 300 psi | $N_2$ @ 250 psi | $N_2$ @ 30 psi | HCl @ 30 psi |
| 1 | Tube cleaning @ atm. pressure | 2 hrs. | | | | | X | X |
| 2 | Dry oxidation @ 150 psi | | | | | | | |
| 2.1 | Stand-by | — | | X | | | | |
| 2.2 | Push | 2 min. | | X | | | | |
| 2.3 | Heat-up & pressurization | 15 min. | | X | | X | | |
| 2.4 | Oxidation | 1 hr. | | X | | X | | |
| 2.5 | $N_2$ anneal and de-pressurization | 15 min. | X | | | | | |
| 2.6 | Buzzer on | 1 sec. | X | | | | | |
| 2.7 | Pull | 5 min. | X | | | | | |
| 3 | Steam oxidation @ 150 psi | | | | | | | |
| 3.1 | Stand-by | — | | X | | | | |
| 3.2 | Push | 2 min. | | X | | | | |
| 3.3 | Heat-up & pressurization | 15 min. | | X | | X | | |
| 3.4 | Oxidation | 1 hr. | | X | X | X | | |
| 3.5 | $N_2$ anneal and de-pressurization | 15 min. | X | | | | | |
| 3.6 | Buzzer on | 1 sec. | X | | | | | |
| 3.7 | Pull | 5 min. | X | | | | | |

* * * * *

UNITED STATES PATENT AND TRADEMARK OFFICE
CERTIFICATE OF CORRECTION

PATENT NO. : 4,268,538
DATED : May 19, 1981
INVENTOR(S) : Monte M. Toole and Raphael Klein It is certified that error appears in the above-identified patent and that said Letters Patent are hereby corrected as shown below:

Columns 5 and 6, see Chart:

HIGH PRESSURE (Oxidation)

to shell $N_2$ at this point delete "250 psi" and insert ---150 psi---.

*Signed and Sealed this*

*Fourth* Day of *August 1981*

[SEAL]

*Attest:*

GERALD J. MOSSINGHOFF

*Attesting Officer*     *Commissioner of Patents and Trademarks*